United States Patent [19]

Ishikawa et al.

[11] Patent Number: 5,350,899

[45] Date of Patent: Sep. 27, 1994

[54] SEMICONDUCTOR WAFER TEMPERATURE DETERMINATION BY OPTICAL MEASUREMENT OF WAFER EXPANSION IN PROCESSING APPARATUS CHAMBER

[76] Inventors: Hiroichi Ishikawa, 127 Vreeland Ct., Mahwah, N.J. 10920; Michael S. Kolesa, 25 Grand St., No. 232, Norwalk, Conn. 06851

[21] Appl. No.: 869,241

[22] Filed: Apr. 15, 1992

[51] Int. Cl.$^5$ .................................................. H05B 1/02
[52] U.S. Cl. ............................. 219/494; 219/121.43; 219/121.44; 219/502; 374/55; 374/120; 356/386
[58] Field of Search ................ 219/121.43, 121.44, 219/497, 494, 502; 156/345; 374/120, 55, 56; 356/384, 386, 387

[56] References Cited

U.S. PATENT DOCUMENTS

| | | | |
|---|---|---|---|
| 3,788,746 | 1/1974 | Baldwin et al. | 356/106 |
| 3,930,730 | 1/1976 | Laurens et al. | 356/106 |
| 4,271,477 | 6/1981 | Williams | 356/563 |
| 4,381,152 | 4/1983 | Riech et al. | 356/385 |
| 4,426,160 | 1/1984 | Couderc | 374/45 |
| 4,636,969 | 1/1987 | Kyoden et al. | 356/560 |
| 4,775,236 | 10/1988 | Cohen et al. | 356/357 |
| 4,854,707 | 8/1989 | Ring et al. | 356/356 |
| 5,102,231 | 4/1992 | Loewenstein et al. | 374/129 |
| 5,221,142 | 6/1993 | Snow | 374/120 |

*Primary Examiner*—Mark H. Paschall
*Attorney, Agent, or Firm*—Wood, Herron & Evans

[57] ABSTRACT

A method and apparatus are provided for measuring the temperature of articles such as semiconductor wafers in a sealed chamber of a processing apparatus such as a batch preheating module of a semiconductor wafer processing cluster tool. Wafers of generally known nominal diameter and coefficient of thermal expansion are placed at a known initial temperature into a processing chamber which is then sealed. A pair of beams of parallel light are passed by opposite edges of the wafer and the uninterrupted light from both beams are detected and summed. When the wafer is heated in processing, light from the beams is measured again. Expansion of the wafers changes the amount of uninterrupted light detected, and the changed amount of light is measured. From the measurement, the initial temperature, the nominal diameter and the known coefficient of expansion, processing temperature is calculated and displayed or used to control chamber heaters. The beams are preferably angled to the wafer planes so that vertical alignment is not critical and so that the beams are interrupted by a single wafer when in a stack. The signals from the detectors can be used to vertically position the wafers.

20 Claims, 3 Drawing Sheets

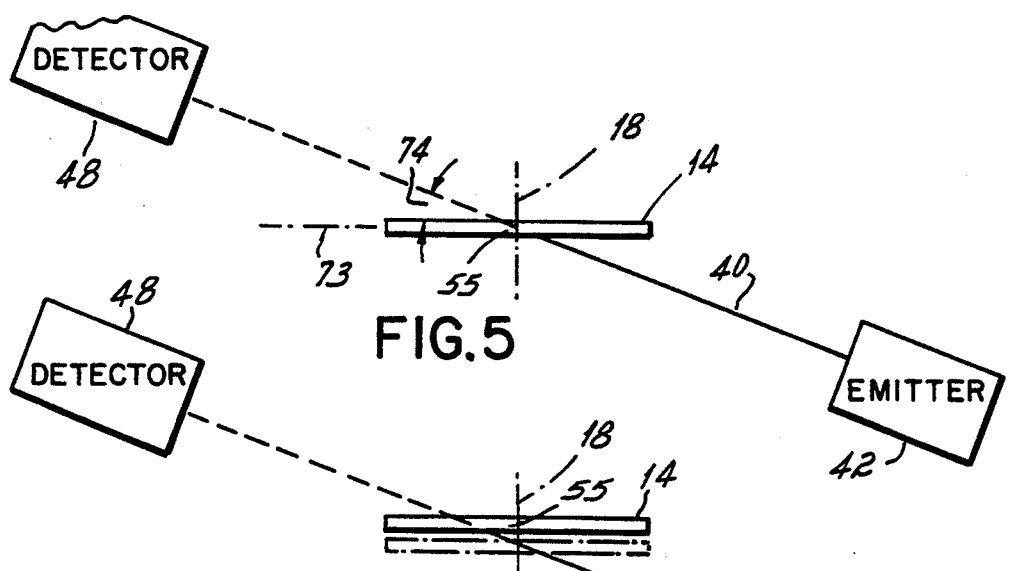
FIG.5
FIG.6
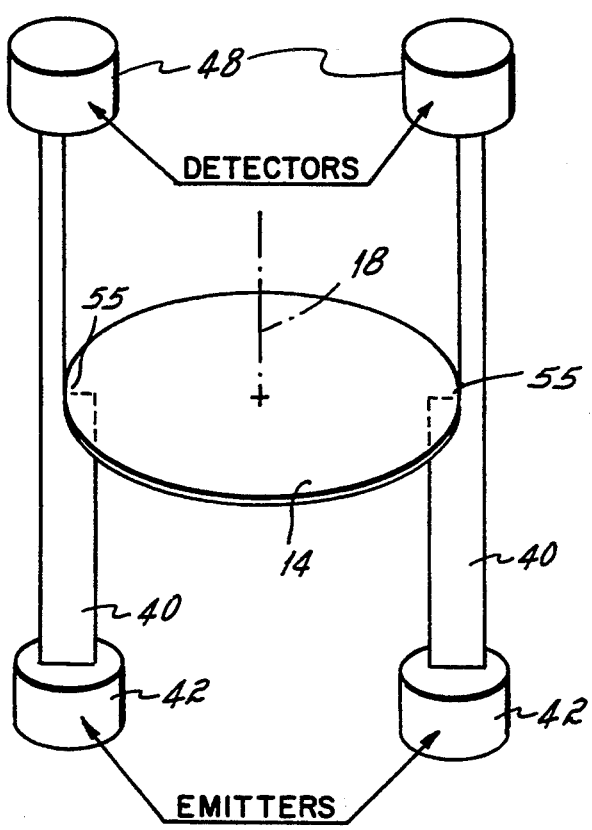
FIG.7
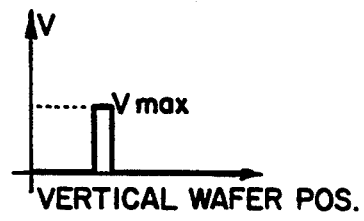
FIG.8
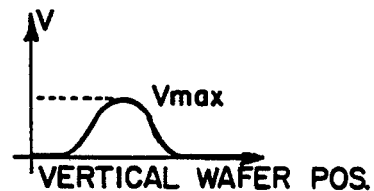
FIG.9
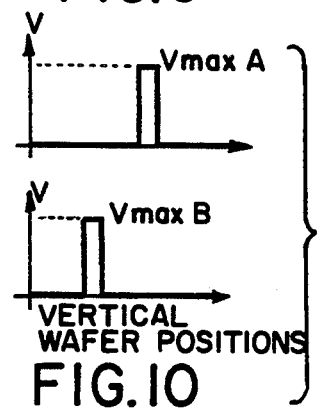
FIG.10

SEMICONDUCTOR WAFER TEMPERATURE DETERMINATION BY OPTICAL MEASUREMENT OF WAFER EXPANSION IN PROCESSING APPARATUS CHAMBER

The present invention relates to the temperature determination of articles such as semiconductor wafers being processed in sealed chambers and more particularly, to noncontact methods of instantaneously determining wafer temperature for the monitoring and control thereof.

BACKGROUND OF THE INVENTION

In the processing of thin, flat articles such as semiconductor wafers, the articles are frequently heated to elevated temperatures for processing in sealed vacuum chambers. Thermal treatment of the wafers is sometimes a necessary or incidental component of a coating or etching process and at other times is the essence of the process itself, such as in rapid thermal processing, annealing or degassing.

In sealed chambers such as vacuum processing chambers, where semiconductor wafers are usually processed, various temperature schemes have been employed. Thermocouples, for example, attached to or are held in contact with the wafer, or mounted in the wafer support are slow to respond to temperature changes and are often introduce a source of wafer contamination. Pyrometers, on the other hand, may avoid direct contact with the articles being processed, but have the disadvantage of being sensitive to the emissivity of the material of which the wafer or coatings added to it are made. Emissivity is also subject to change during processing.

Optical methods for indirectly measuring the temperature of an article by measuring its thermal expansion have been proposed. These optical methods provide an advantage of being related only to the coefficient of thermal expansion of the material that forms a structural core of the wafer, which is constant and can be reliably determined. Such proposed methods have, for example, included the formation of images of the article, and have required equipment such as optical sensors placed close to the article where their accuracy is affected by the process within the chamber. Such methods are in practice used off-line, and where so used, atmospheric refraction can detract from the accuracy of the measurement process.

Where articles such as semiconductor wafers are mounted on a support within a sealed chamber for processing, particularly where wafers are processed in batches, as is often the case in degassing or other thermal treatment processes, misalignment or distortion of the support may alter the wafer position and render optical temperature determination methods unreliable.

Accordingly, there is a need for a temperature determination method and apparatus particularly useful for the processing of semiconductor wafers in sealed chambers, and more particularly useful in processes wherein multiple wafers are simultaneously processed, to accurately and instantaneously determine the wafer temperature. Further, there is a need to provide such a temperature determination method which is less affected by sources of measurement error such as the accuracy and the positioning of the article, changes in article emissivity or atmospheric distortion of the measured medium.

SUMMARY OF THE INVENTION

It is a primary objective of the present invention to provide a method and apparatus for instantaneously and accurately determining the temperature of thin plate-like articles such as semiconductor wafers during processing in, for example, the vacuum chambers of semiconductor wafer processing machines.

It is a more particular objective of the present invention to provide a temperature determination system, which can be used for temperature measurement or temperature control in thermal processing modules of semiconductor wafer processing machines such as in degassing chambers thereof where stacked pluralities of wafers are simultaneously processed.

It is a further and more particular objective of the present invention to provide a noncontact instantaneous temperature determination method and apparatus employing components located outside of a processing chamber that will instantly and accurately determine the temperature of the objects within.

It is an additional objective of the present invention to provide a thermal expansion optical measurement system having low sensitivity to wafer positioning error or dimensional tolerances, and which will otherwise overcome the problems of the prior art.

According to the principles of the present invention, there is provided a method and apparatus for determining the temperature of thin plate-like articles, such as semiconductor wafers formed of materials of known coefficient of thermal expansion, during processing in sealed chambers, such as vacuum processing chambers of semiconductor wafer processing machines. In accordance with the principles of the present invention, changes in the dimension of a wafer are measured as the wafer is heated or cooled from a first known temperature to a second unknown temperature. The need for such a measurement is typical for example, where wafers are placed in a pretreatment module at atmospheric temperature conditions, and then heated to a second temperature at which the wafers will be thermally processed or subjected to some other process in which temperature must be monitored or controlled.

According to the method of the present invention, articles are placed in a chamber for processing at a generally known initial temperature and the initial positions of generally opposite portions of its edges are determined. The edge position information is then stored. Then temperature of the wafer is changed, usually by heating in the direction of a desired processing temperature at which the wafers are to be processed. Then, the positions of the same edge portions are again determined and, from this determination and the stored information of the initial determination of edge position, the amount of expansion of the wafer is calculated. Since the overall distance between the edge portions and coefficient of expansion are known, the second or unknown temperature is calculated. From this calculation, an output signal is generated and communicated to an output device for monitoring purposes or fed back to a control circuit for control of the processing temperature.

In accordance with the preferred apparatus of the present invention, a support is provided in the processing chamber to hold the wafer, the temperature of which is to be monitored, in a plane within the chamber. Sources of light, preferably of parallel light, such as the coherent light that emanates from a laser, direct a spaced pair of beams along two preferably parallel paths, positioned to intersect the locations that respectively opposite edges of the wafer are expected to occupy. The two beams have a nominal width, and the wafer edges extend partially across each beam to interrupt a portion, but not all, of the light from each source.

Opposite each of the wafer edges from the sources is provided a spaced pair of light sensors or detectors. These detectors preferably are responsive to the amount of light impinging upon them from the sources. Accordingly, the detectors preferably produce analog signal outputs representative of the amount of light, uninterrupted by the wafer edges, to reach the sensors from the light sources. Preferably also, the outputs of the two sensors are summed so that misalignment of the wafers from side to side does not change the total amount of uninterrupted light reaching the sensors, unless the dimension or distance between the two edges of the wafer has changed. Expansion of the wafer due to a temperature change causes this dimension of the wafer to increase, interrupting more light and reducing the total light energy impinging on the sensors. Thus, the summed analog signal produced varies in relation to the expansion of the wafer.

Preferably, the output of the sensors is measured first at a known initial temperature and the result is digitized and stored in a storage device. Then the output of the sensors is measured after the wafer is heated, and the result of the measurement digitized. The digital result is then fed to a microprocessor along with parameters such as the coefficient of expansion of the material, and the current temperature is immediately calculated.

In accordance with the preferred embodiment of this invention, the light beams are angled to the plane of the wafer so that a slight displacement of the wafer, the temperature of which is being measured, in the direction of an axis perpendicular to its plane will be less detrimental to the measurement process by preventing the displaced wafer from totally missing the beams. Where a single wafer is employed, this angle may be directed at a 90° angle to the plain of the wafer, so that axial displacement of a wafer will not change the position of the wafer edges with respect to the beams. In one preferred embodiment of the present invention, where wafers are thermally processed in batches and arranged in a stack in the processing chamber, orientation of the light beams parallel to the axis is not desirable, because more than one wafer will lie in the paths of the beams. Such stacked wafers will lie each in a separate plane and each will be spaced along a common axis that is perpendicular to the planes. In this application, the beams are angled with respect both to the planes of the wafers and to the axis, and preferably is inclined at the maximum angle with respect to the planes to which the beams can be inclined so as to be intercepted by only one wafer of the stack.

Further, in accordance with principles of the present invention, one or more beams is provided at each of the opposite edge sections of a wafer, and the support is adjusted up or down until a maximum interruption of a beam occurs, to thereby accurately place the wafer most centrally in the beams. Where the beams of light are oriented parallel to the plane of the wafer being measured, two axially spaced springs are advantageous providing information for this axial adjustment. Preferably, however, a single inclined beam on each of the two opposite edges of the wafer produces a continuously varying signal over a broader range of axially adjustment, and an output signal so produced at the sensors have a maximum or minimum to which the wafer position may be axially adjusted for optimum placement.

The present invention provides for instantaneous measurement of temperature and is useful for real-time temperature monitoring or temperature feedback control. The measurement has low sensitivity to error producing conditions such as tolerances or errors in the axially positioning of a single wafer or stack of wafers in the processing module.

These and other objectives and advantages of the present invention will be more readily apparent from the following detailed description of the drawings in which:

BRIEF DESCRIPTION OF THE DRAWINGS

FIG. 5 is a side elevational diagram of another preferred embodiment of the present invention wherein the light beams are inclined at angles to both the plane and the axis of a wafer.

FIG. 6 is a view similar to FIG. 5, but in which the wafer is axially displaced from its ideal position.

FIG. 7 is a diagram illustrating the light beams oriented parallel to the axis of a wafer according to another preferred embodiment of the invention.

FIG. 8 is a diagram illustrating the sensor output as a function of wafer position with the arrangement of FIGS. 3 & 4.

FIG. 9 is a graph or diagram of the sensor output as a function of wafer position with the arrangement of FIGS. 5 & 6.

FIG. 10 is a pair of graphs illustrating sensor output wherein a pair of axially spaced light beams are oriented as those of FIGS. 3 & 4 are employed.

DETAILED DESCRIPTION OF THE DRAWINGS

Figure 1:
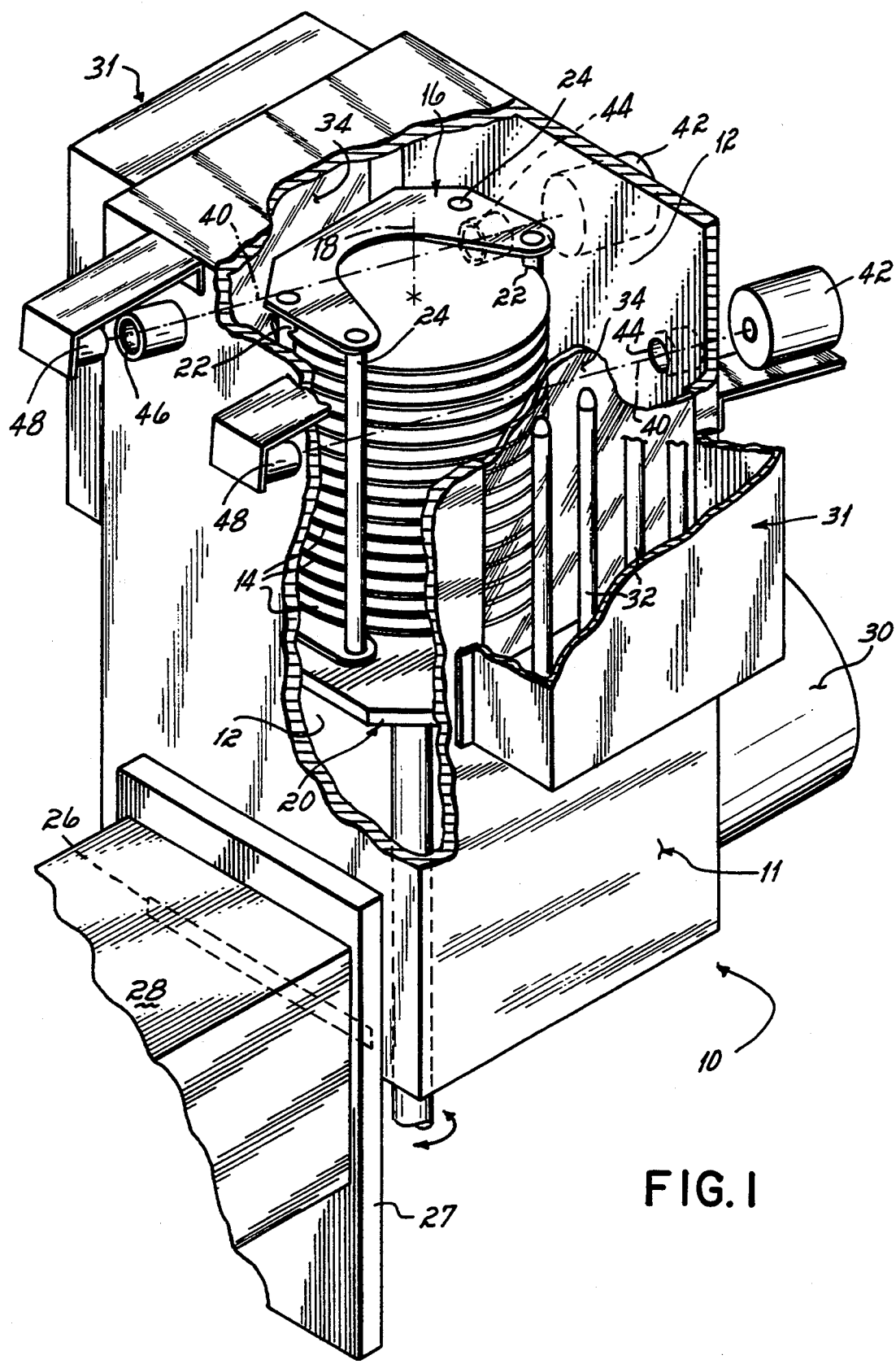
FIG. 1 is perspective view, partially cutaway, of a wafer processing module, particularly a degassing module for a silicon wafer processing cluster tool and having a vacuum chamber sealed therein in which is supported a vertical stack of horizontally oriented wafers for thermal processing according to one embodiment of the present invention.

Referring to FIG. 1, one embodiment of the present invention is illustrated in a semiconductor wafer batch preheating module 10 of a semiconductor wafer processing cluster tool such as that disclosed in commonly assigned and co-pending U.S. Pat. application Ser. No. 07/701,800, filed May 17, 1991, entitled "Wafer Processing Cluster Tool Batch Preheating and Degassing Method and Apparatus", hereby expressly incorporated herein by reference. The module 10 includes a sealed housing 11 enclosing a vacuum chamber 12 in which wafers 14 are processed. In the application formed by the module 10, the process performed is one of preheating or preconditioning the wafers 14 for the purpose of removing absorbed gases and vapors prior to the processing of the wafers in other modules of the semiconductor wafer processing apparatus. In the module 10, the wafers 14 are supported in a multiple wafer support or rack 16 on which they are vertically stacked. The wafers 14 are typically circular, thin flat plates or planar disks of approximately 0.75 millimeter in thickness and 150 or 200 millimeters or larger in diameter. When stacked on the rack 16, each of the wafers 14 lies in a horizontal plane and is spaced from and aligned with the adjacent wafers on the stack on a vertical axis 18.

The rack 16 is supported in the chamber 12 on a vertically movable and rotatable elevator 20. The rack 16 has a plurality of wafer holders formed by a plurality of slots 22 in four vertical quartz rods 24. The wafers 14 are individually loaded into the rack 16 as the elevator 20 is vertically indexed to bring slots 22 into alignment with a wafer loading port 26 in the housing 12. The port 26 sealably communicates between the inside vacuum chamber 12 of the housing 11 and the interior vacuum chamber of a wafer transport module 28 which has supported therein a robotic wafer handling mechanism (not shown) for transferring wafers to and from the degassing chamber 12 of the module 10 and to and from other processing modules of the wafer processing apparatus. The vacuum in the chamber 12 is maintained by conventional cryogenic vacuum pumps 30 connected to the chamber 12 through the housing 11.

In a typical heat treatment process such as the batch preheating process performed with the module 10, wafers 14 are individually loaded through the open gate valve 26 and into the slots or holders 22 of the rack 16 as the elevator 20 is indexed past the port 26. Then, the gate valve 27 is closed with the vacuuming chamber 12 at the same level as that in the chamber of the transport module 28. The wafers 14 at this time are generally at a known initial temperature, which is the temperature of the chamber within the transport module 28 and of the atmosphere or room surrounding the module 10.

In the preheating or degassing process, the chamber 12 may be changed to a pressure different from that of the transport module 28 or maintained at the same pressure through operation of the pump assembly 30. In the process, the wafers 14, which are stacked on the rack 16 in the sealed chamber 12, are uniformly brought to an elevated temperature by the energizing of radiant heaters 33 having lamps 32 arranged in sets on the opposite sides of the chamber 12 on the outside thereof behind quartz windows 34 in opposed walls of the housing 11. This elevated or processing temperature which may be, for example, 500° C., should be maintained for some predetermined processing time of, for example, fifteen minutes, during which the processing temperature must be monitored and controlled.

The monitoring of the temperature, according to the present invention, is achieved by measuring the diameter of one wafer, first at the known initial temperature and then at the processing temperature. Then the thermal expansion of the wafer between the two temperatures is calculated and, from the initial temperature, the coefficient of expansion of the wafer and initial diameter of the wafer which are known, calculations are made to determine the processing temperature.

The measurement of wafer expansion is achieved by passing a pair of parallel light beams 40 from a pair of light sources 42, mounted outside of the housing 11 of the chamber 12, through view ports 44, and passed opposite edge sections of one of the wafers 14 of the stack. The two beams 40 are shadowed by the opposite edges of the wafer, and an uninterrupted portion of the light from each passes in a direct line out view ports 46 on the opposite side of the chamber 12 from the light sources 42, where the amount of light which is uninterrupted from each beam is measured by a similarly spaced pair of light sensors 48 as is more particularly illustrated in the diagram of FIG. 2.

Figure 2:
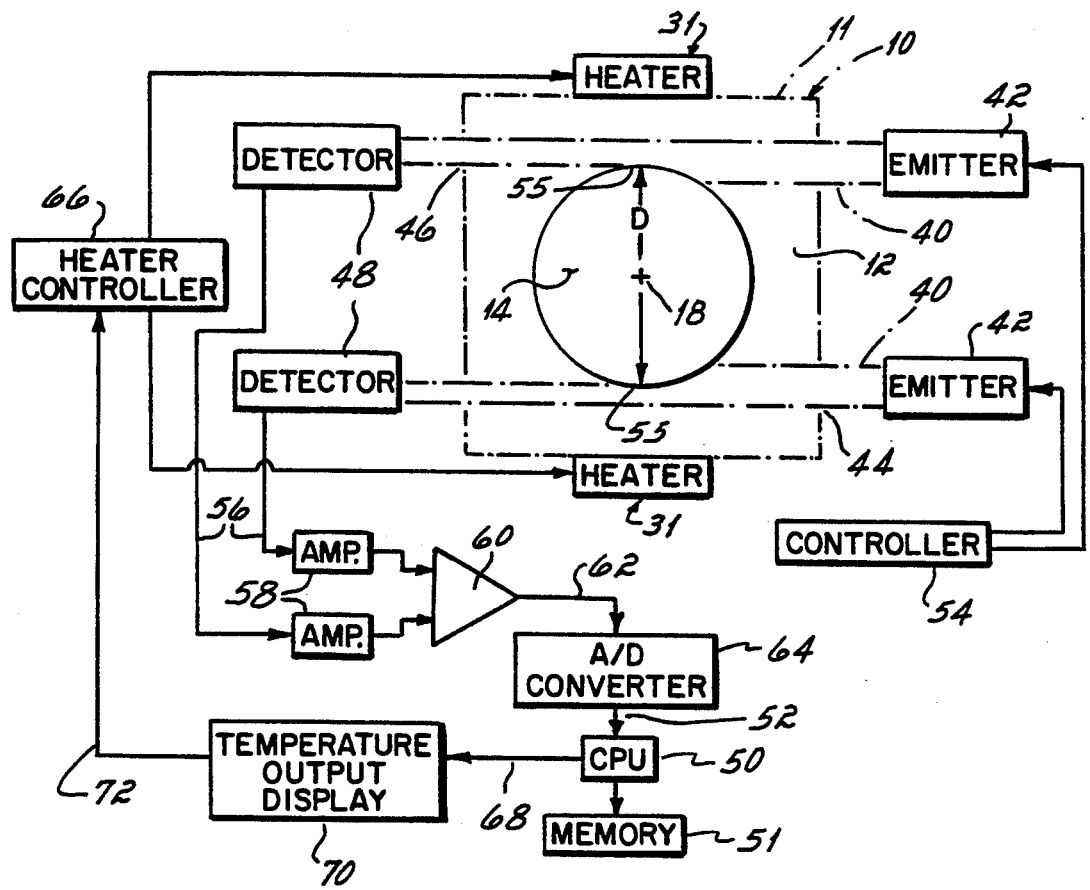
FIG. 2 is a top plan view diagrammatically illustrating in block form, the signal processing and control circuit of the module of FIG. 1, and the positioning of a pair of light beams in relation to the edges of a wafer, the temperature of which is to be measured.

Referring to FIG. 2, the measurement technique of the present invention is better illustrated. In FIG. 2, one of the wafers 14 is shown in a top view lying in a horizontal plane. The wafer 14 is circular having a center on the vertical axis 18 and is of a known diameter D. The diameter D of the wafer 14, as well as its initial temperature, and the coefficient of expansion of the material of which the wafer is made, usually silicon, are stored in a memory device associated with a computer 50. While the various wafers 14 have diameters which differ slightly from one another, this variation has a negligible affect on the temperature measurement process. For example, a one millimeter deviation in the determination of the diameter D of a 200 mm, wafer will result in an error in the measurement of the difference between the processing temperature and the initial temperature of approximately one half of one percent.

In the wafer expansion measurement, a digital value is input on a line 52 to the computer 50 representative of the diameter of the wafer 14 at the temperature of the wafer 14 at the time the diameter is being measured. This signal is produced by energizing a pair of lasers 42 or other light sources capable of producing beams of parallel light 40. The lasers 42 are controlled by a laser controller 54. The light sources 42, when activated, generate two beams of parallel light 40 which are aimed from outside of the chamber 12 through the chamber 12 in parallel beams, each to a respective one of the pair of light detectors 48 outside of the chamber 12 opposite from the light sources 42. Each of the detectors 48, receives energy from the light beams 40 and produces an analog signal on a respective one of the lines 56, each signal being generally proportional to the amount of light form the laser beam received by the detector 48. The analog signals on the lines 56 are amplified by a pair of amplifiers 58 and summed in a summing amplifier 60 to produce a combined analog signal on line 62 which generally varies linearly with the diameter of the wafer 14.

The wafer 14 has its opposite edges 55 extending into the paths of the beams 40, shadowing the light impinging upon the detectors 48. A change in the diameter D of the wafer 14 results in a decrease in the amount of light impinging on the detectors 48 as the diameter of the wafer 14 increases. The summing of the signals from the lines 56 by the amplifier 60 cancels any error in the horizontal placement of the wafer 14 with respect to the beams 40 in that, as the horizontal position of the wafer is varied transverse the beams, the signal from one detector 48 increases while the signal from the other detector 48 decreases, and the analog sum on the line 62 remains the same. The signal on the line 62 is then converted to the digital signal on the line 52 by the analog to digital converter 64.

In operation, the wafer 14 is first measured at the initial room temperature at which it was loaded into the chamber 12 producing a digital signal on line 52 which is stored in the memory device of the computer 50. Then, the heaters 32 are activated by a heater control 66 to raise the temperature of the wafer to approximately a processing temperature. As the temperature of the wafer 14 increases, the diameter D increases reducing the amount of light impinging on the detectors 48 and producing a corresponding change in the signals on the line 56. The signals are inverted by the amplifiers 58 to produce a signal on line 62 which increases in proportion to the expansion of the wafer 14.

Accordingly, the actual temperature of the heated wafer is reflected in a digital number on line 52 which corresponds to the increased diameter of the wafer due to thermal expansion. This number is then input into the computer 50 where it is processed in accordance with the approximately linear algorithm relating to the coefficient of expansion, the initial diameter of the wafer and the initial temperature stored in memory device 51 to produce the calculated output temperature signal on line 68 to a temperature output display 70. This temperature output signal is also fed back along a control line 72 in the form of a control signal to the heater controller 66 to instantaneously provide feedback control of the heaters 32 for the control of the temperature within the chamber 12.

Figure 3:
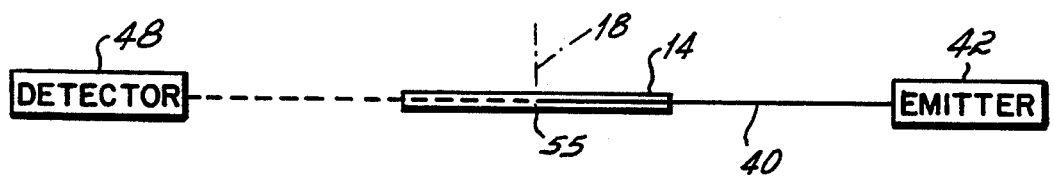
FIG. 3 is a side elevational view of the diagram of FIG. 2 illustrating the light beams parallel to the plane of the wafer.
Figure 4:
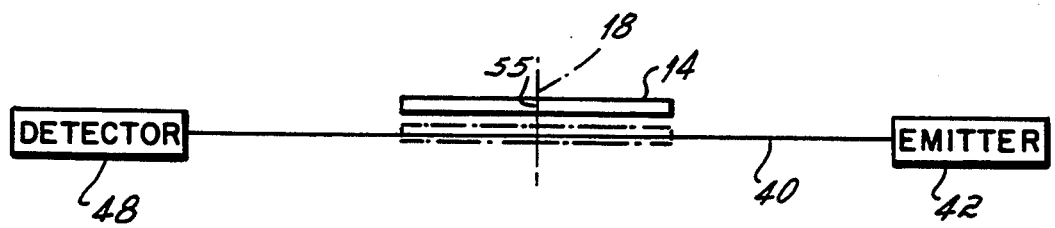
FIG. 4 is a diagram similar to FIG. 3, but with the wafer axially displaced from its ideal position.

The light beams 40 may be directed horizontally to lie in the plane of the wafer 14 as illustrated in FIG. 3. However, with this arrangement, it is necessary to insure that the wafer 14 be precisely positioned, by vertical adjustment of the elevator 20 to align the beams 40. Otherwise, the beam 40 might totally miss the thin wafer 14 as illustrated in the diagram of FIG. 4. Indeed, thermal expansion of the rack 16 could cause such a height change of the wafer 14, as the temperature within the chamber 12 is elevated.

To reduce the sensitivity to this height position, the preferred embodiment of the invention utilizes light beams 40 inclined at a small angle 74 to the plane 73 of the wafer 14, as illustrated in FIGS. 5 & 6 and also in FIG. 1. So inclined, a height change as illustrated in FIG. 6, is less likely to result in the light beams 40 missing the wafer 14 by a material degree, which would cause an intolerable error in the amount of light reaching the detectors 48. The greater this angle 74 the less significant the error which will result by vertical displacement of the wafer 14.

Accordingly, with the light beams 40 inclined at a 90° angle, as shown in FIG. 7, and thereby parallel to the axis 18 of the wafer 14, the height change of any magnitude will result in no error at all. However, were a plurality of wafers 14 as employed in a stack, the light beams 40 should be directed past only a single one of the wafers 14. Accordingly, the light beams 40 should also be inclined at an angle to the axis 18 which is sufficiently great to prevent the beams 40 from being interrupted by more than one of the wafers 14 of the stack.

Where adjustment of the elevator 20 is necessary to being a wafer 14 in proper alignment with the beams 40, the light sources 42 and detectors 48 may also be used for this positioning. Referring to FIGS. 3, 4 & 8, the output or monitoring signal on line 62 may take the form of the step function shown in FIG. 8 as the wafer passes into through and out of the beams 40, which are parallel to its plane.

With the inclined beams 40 as shown in FIGS. 5 & 6, the signal on the line 62 is represented by the graph of FIG. 9. The maximum value of this continuous function can be sought to properly position the wafer 14 on the rack 16 by adjusting the elevator 20.

With the horizontal arrangement of FIGS. 3 & 4, such vertical elevator adjustment can be made by employing two levels of sensors and light sources to produce two sets of vertical spaced light beams. As such, to output signals will result as shown in FIG. 10, which may provide information for the elevator adjustment.

It will be appreciated by those skilled in the art that the description of the embodiments above is but of some of the embodiments of the invention. Accordingly, additions and modifications may be made without departing from its principles.

What is claimed is:

1. A method of determining the temperature of and thermally processing wafers, of a material having a known coefficient of thermal expansion, stacked in parallel planes on an axis in a vacuum processing chamber of a wafer processing apparatus, the method comprising the steps of:

placing a wafer stack in the chamber at a reference temperature;

passing a spaced pair of beams of parallel light from at least one light source and along respective paths such that at least a portion of the light from each light beam is interrupted by opposite edges of one wafer of the stack when at the reference temperature, the paths being inclined at an angle to the axis and the planes;

sensing with at least one light sensor, the amount of uninterrupted light from the beams that arrives opposite the edge from the light source, and generating a reference signal, representative of the positions of the edges, in response to the sensed light;

storing the reference signal;

changing the temperature of the wafers of the stack to a processing temperature;

further passing a spaced pair of beams of parallel light along the paths from the source and through the chamber such that at least a portion of the light from each light beam is interrupted by the opposite edges of the one wafer when at the processing temperature;

sensing with the sensor the amount of uninterrupted light from the beams arriving opposite the edge from the light source, when at the processing temperature, and generating, in response to the sensed light, a measurement signal representative of the positions of the edges;

generating, from the stored reference and the processing signals, a dimension change signal responsive to the difference between the dimensions of the one wafer at the reference temperature and at the processing temperature; and deriving the processing temperature from the known coefficient of expansion of the material and the dimension change signal.

2. The method of claim 1 wherein:

the reference and measurement signal generating steps each include the step of generating an analog signal responsive to the amount of light uninterrupted by the edges;

the step of generating the dimension change signal is responsive to the difference between the magnitudes of the reference signal and the measurement signal; and the deriving step includes the steps of producing a digital form of the dimension change signal and digitally deriving the processing temperature therefrom.

3. The method of claim 1 further comprising the steps of:

generating a control signal in response to the derived processing temperature; and controlling the processing temperature in response to the control signal.

4. The method of claim 1 further comprising the step of:

adjusting the position of the stack on its axis, when the wafers are at the reference temperature, until the uninterrupted light sensed at is at a minimum.

5. The method of claim 1 wherein:

the beams are passed from at least one source outside of the chamber and along respective paths through the chamber, and the uninterrupted light is sensed by at least one sensor positioned outside of the chamber opposite the light source.

6. The method of claim 1 wherein:

the uninterrupted light from each beam is sensed by a separate sensor; and the reference and measurement signals are generated in response to the sums of the uninterrupted light sensed by the sensors.

7. A method of determining the temperature of and thermally processing a thin flat article, of a material having a known coefficient of thermal expansion, lying in a plane in a processing chamber of a processing apparatus, the method comprising the steps of:

supporting an article in the chamber at a known reference temperature;

passing a spaced pair of beams of parallel light from a pair of light sources, positioned outside of the chamber, and along respective paths through the chamber such that a portion of the light from each light beam is interrupted by opposite edges of the article when at the reference temperature;

sensing with a pair of light sensors, the amount of uninterrupted light from the beams arriving opposite the edge from the light sources, and generating an analog reference signal, having a magnitude representative of the positions of the edges, in response to the sensed light;

storing a digital representation of the reference signal;

changing the temperature of the article to a processing temperature;

further passing a spaced pair of beams of parallel light along the paths from the sources and through the chamber such that a portion of the light from each light beam is interrupted by the opposite edges of the article when at the processing temperature;

sensing with the sensors the amount of uninterrupted light from the beams arriving opposite the edge from the light sources, when at the processing temperature, and generating, in response to the sensed light, a measurement signal representative of the positions of the edges;

generating, from the stored representation of the reference signal and the processing signal, a digital dimension change signal responsive to the difference between the magnitudes of the reference and measurement signals and representative of the difference between the dimensions of the article at the reference temperature and at the processing temperature; and digitally deriving the processing temperature from the known coefficient of expansion of the material and the dimension change signal.

8. The method of claim 7 wherein:

the path is inclined at an angle to the plane.

9. The method of claim 8 wherein:

the path is inclined at an angle to an axis perpendicular to the plane.

10. The method of claim 7 further comprising the steps of:

generating a control signal in response to the derived processing temperature; and controlling the processing temperature in response to the control signal.

11. The method of claim 7 further comprising the step of:

adjusting the position of the stack on its axis, when the article is at the reference temperature, until the uninterrupted light sensed at is at a minimum.

12. The method of claim 7 wherein:

the reference and measurement signals are generated in response to the sums of the uninterrupted light sensed by the sensors.

13. An apparatus for processing semiconductor wafers of a material having a known coefficient of thermal expansion, the apparatus having a chamber in which a wafer is maintained at a processing temperature to be monitored, the apparatus comprising:

a wafer support for supporting a wafer, the temperature of which is to be monitored, in a plane within the chamber, the wafer having a pair of generally opposite edge sections lying in the plane when supported on the support;

a light source spaced from the edge sections of the wafer and operable to direct a spaced pair of beams of parallel light therefrom and along respective paths fixed in relation to the support such that a portion of the light of each light beam is interrupted by the generally opposite edge sections of the wafer in an amount corresponding to the position of the edge sections transverse the path;

at least one light sensor positioned opposite the edge sections of the wafer from the light source and operable the amount of uninterrupted light from the beams;

a monitoring signal generator operable to generate a monitoring signal in response to the amount of uninterrupted light from the beams impinging on the sensor;

an information storage medium for storing information in response to a monitoring signal generated with the wafer at a first temperature;

a temperature control operative to change the temperature of the wafer on the support to a second temperature; and a circuit responsive to the stored information, the known coefficient of thermal expansion and a monitoring signal generated with the wafer at a second temperature for generating an output signal representative of the difference between the first temperature and the second temperature.

14. The apparatus of claim 13 wherein:

the wafer support includes a rack configured to support a plurality of wafers, including the wafer whose temperature is to be monitored, stacked in parallel planes on an axis in the chamber of the apparatus;

the sensor being oriented such that the paths are inclined at an angle to the axis so that the light therefrom is interrupted by edge sections of only one wafer of the stacked plurality.

15. The apparatus of claim 13 wherein:

the monitoring signal generator includes an analog signal generator responsive to the amount of light uninterrupted by the edge sections;

the monitoring signal is an analog signal; and the output signal generator includes a digital signal generator operable to digitally derive the output signal the digital signal.

16. The apparatus of claim 13 further comprising:

a control signal generator operable for generating a control signal in response to the output signal; and the temperature controller being responsive to the control signal.

17. The apparatus of claim 13 wherein:

the light source and the light sensor are located outside of the chamber at opposite ends of the paths.

18. The apparatus of claim 13 wherein:

the at least one light sensor includes a pair of light sensors, each for sensing the uninterrupted light from a respective beam; and the output signal generator is responsive to the sums of the uninterrupted light sensed by the sensors.

19. The apparatus of claim 13 wherein:

the path is inclined at an angle to the plane of the wafer of which the temperature is to be monitored.

20. The apparatus of claim 13 wherein:

the sensor includes at least one laser operable to generate the beams of light along the paths.

* * * * *